United States Patent
Macelwee

(10) Patent No.: US 11,676,899 B2
(45) Date of Patent: *Jun. 13, 2023

(54) EMBEDDED PACKAGING FOR HIGH VOLTAGE, HIGH TEMPERATURE OPERATION OF POWER SEMICONDUCTOR DEVICES

(71) Applicant: GaN Systems Inc., Kanata (CA)

(72) Inventor: Thomas Macelwee, Nepean (CA)

(73) Assignee: GaN Systems Inc., Kanata (CA)

( * ) Notice: Subject to any disclaimer, the term of this patent is extended or adjusted under 35 U.S.C. 154(b) by 221 days.

This patent is subject to a terminal disclaimer.

(21) Appl. No.: 17/061,839

(22) Filed: Oct. 2, 2020

(65) Prior Publication Data

US 2021/0020573 A1 Jan. 21, 2021

Related U.S. Application Data

(63) Continuation of application No. 16/380,318, filed on Apr. 10, 2019, now Pat. No. 10,796,998.

(51) Int. Cl.
*H01L 29/78* (2006.01)
*H01L 23/532* (2006.01)
(Continued)

(52) U.S. Cl.
CPC ...... *H01L 23/5329* (2013.01); *H01L 29/2003* (2013.01); *H01L 29/778* (2013.01);
(Continued)

(58) Field of Classification Search
CPC . H01L 2924/00014; H01L 2924/00012; H01L 2924/181; H01L 2924/13055
See application file for complete search history.

(56) References Cited

U.S. PATENT DOCUMENTS 9,589,868 B2 3/2017 McKnight-MacNeil et al.
9,589,869 B2 3/2017 McKnight-MacNeil et al.
(Continued)

FOREIGN PATENT DOCUMENTS

WO 2013001726 1/2013

OTHER PUBLICATIONS

EPO English Machine translation of JP5696786 equivalent of WO2013001726; 39 pages.
(Continued)

*Primary Examiner* — Jaehwan Oh
(74) *Attorney, Agent, or Firm* — Miltons IP/p.i.

(57) ABSTRACT

Embedded packaging for high voltage, high temperature operation of power semiconductor devices is disclosed, wherein a semiconductor die is embedded in a dielectric body comprising a dielectric polymer composition characterized by a conductivity transition temperature Tc, a first activation energy $Ea_{Low}$ for conduction in a temperature range below Tc, and a second activation energy $Ea_{High}$ for conduction in a temperature range above Tc. A test methodology is disclosed for selecting a dielectric epoxy composition having values of Tc, $Ea_{Low}$, and $Ea_{High}$ that provide a conduction value below a required reliability threshold, e.g. $\leq 5\times10^{-13}$ S/cm, for a specified operating voltage and temperature. For example, the power semiconductor device comprises a GaN HEMT rated for operation at $\geq 100$V wherein the package body is formed from a laminated dielectric epoxy composition for operation at $>150$ C, wherein Tc is $\geq 75$ C, $Ea_{Low}$ is $\leq 0.2$ eV and $Ea_{High}$ is $\leq 1$ eV, for improved reliability for high voltage, high temperature operation.

21 Claims, 12 Drawing Sheets

(51) Int. Cl.
*H01L 29/20* (2006.01)
*H01L 29/778* (2006.01)
*H01L 29/16* (2006.01)
*H01L 29/739* (2006.01)

(52) U.S. Cl.
CPC ...... *H01L 29/1608* (2013.01); *H01L 29/7393* (2013.01); *H01L 29/78* (2013.01)

(56) References Cited

U.S. PATENT DOCUMENTS

| | | | |
|---|---|---|---|
| 9,659,854 B2 | 5/2017 | Klowak et al. | |
| 9,824,949 B2 | 11/2017 | McKnight-MacNeil et al. | |
| 2010/0048789 A1 | 2/2010 | Shieh et al. | |
| 2015/0171240 A1* | 6/2015 | Kapur | H01L 31/0516 |
| | | | 438/98 |
| 2015/0214129 A1* | 7/2015 | Kawakita | H01L 21/568 |
| | | | 257/712 |
| 2017/0077019 A1* | 3/2017 | Sugaya | H01G 4/228 |
| 2017/0301633 A1* | 10/2017 | Kobayashi | H01L 23/04 |
| 2018/0254228 A1* | 9/2018 | Kuga | H01L 23/24 |
| 2018/0366400 A1* | 12/2018 | Mohn | H01L 25/072 |
| 2019/0021175 A1 | 1/2019 | Tosaka et al. | |
| 2019/0363029 A1* | 11/2019 | Guillon | H01L 23/053 |
| 2020/0066609 A1* | 2/2020 | Mohn | H01L 23/4334 |
| 2020/0105677 A1* | 4/2020 | Chiba | H01L 23/5389 |

OTHER PUBLICATIONS

GaN Systems Inc., Product list dated Jan. 2019; 4 pages.
GaN Systems Inc. Application Note GN002 entitled "Thermal Design for GaN Systems' Top-side cooled GaNPX®-T packaged devices" (Oct. 30, 2018); 20 pages.
Hitachi, MCL-E-770G Type (R) product datasheet, p. 16-17 from Catalog dated Jun. 2018.
Panasonic, R1577 product datasheet, dated Jun. 2017; 7 pages.

* cited by examiner

GaN die embedded in dielectric epoxy package body

Dielectric epoxy laminate/prepreg layers

Example 2

Example 4

| Sample | Structure Core/Dopants | Gas | Eg1 (eV) UP | Eg2 (eV) LT | Tc (C) | Conductivity S/cm @ 50C | Leakage A/cm² @ 100C |
|---|---|---|---|---|---|---|---|
| DOE7500 | Z R1577/R1570 | SLS | 1.5 | 0.34 | 79.0 | 5.16e-11 | 9.14e-6 |
| | | FL | 1.3 | 0.29 | 80.8 | 8.34e-12 | 1.60e-6 |
| DOE7501 | Z R1577/E-7706 | SLS | 0.62 | 0.16 | 75.8 | 4.75e-14 | 1.0e-8 |
| | | FL | 0.67 | 0.09 | 85.6 | 2.27e-14 | 2.96e-9 |
| DOE7502 | Z R1577/DSA-1000 | SLS | 1.09 | 0.35 | 61.9 | 1.20e-11 | 1.60e-6 |
| | | FL | 0.89 | 0.4 | 47.1 | 1.07e-11 | 1.48e-6 |
| DOE7503 | Z R1577/E-775 | SLS | 0.90 | 0.43 | 69.0 | 2.95e-12 | 5.30e-7 |
| | | FL | 0.81 | 0.39 | 57.2 | 2.31e-12 | 4.20e-7 |
| DOE7504 | Z R1577/E-679 | SLS | 0.84 | 0.18 | 82.0 | 1.8e-13 | 2.50e-8 |
| | | FL | 0.77 | 0.16 | 79.7 | 1.4e-13 | 1.80e-8 |

Fig. 16

EMBEDDED PACKAGING FOR HIGH VOLTAGE, HIGH TEMPERATURE OPERATION OF POWER SEMICONDUCTOR DEVICES

CROSS-REFERENCE TO RELATED APPLICATION(S)

This application is a Continuation of U.S. patent application Ser. No. 16/380,318, filed Apr. 10, 2019 entitled "EMBEDDED PACKAGING FOR HIGH VOLTAGE, HIGH TEMPERATURE OPERATION OF POWER SEMICONDUCTOR DEVICES", which is incorporated herein by reference in its entirety.

TECHNICAL FIELD

This invention relates to embedded packaging for power semiconductor devices, such as Gallium Nitride (GaN) High Electron Mobility Transistors (HEMTs), for high voltage and high temperature operation, and test methodologies for assessing materials systems for embedded packaging of power semiconductor devices.

BACKGROUND

GaN power transistors, such as GaN HEMTs, provide for high current, high voltage operation combined with high switching frequency. For some power applications, GaN power devices and systems offer advantages over silicon technology using Si IGBTs and diodes and SiC power transistors and diodes. For example, power switching systems comprising lateral GaN transistors provide higher efficiency switching, with lower losses, and smaller form factor than comparable systems based on silicon or SiC technology. To benefit from the inherent performance characteristics of lateral GaN transistors, important design considerations include, e.g.: device layout (topology), low inductance interconnect and packaging, and effective thermal management. Lateral GaN power transistors for high current operation at 100V and 650V operation are currently available from GaN Systems Inc. based on Island Technology® that provides a large gate width $W_g$, low on-resistance, $R_{on}$, and high current capability per unit active area of the device.

Packaging solutions that offer low inductance interconnections, and either top-side or bottom-side thermal pads, are disclosed, for example, in the Applicants earlier filed patent applications: U.S. patent application Ser. No. 15/027,012, filed Apr. 15, 2015, now U.S. Pat. No. 9,659,854, entitled "Embedded Packaging for Devices and Systems Comprising Lateral GaN Power Transistors"; U.S. patent application Ser. No. 15/064,750, filed Mar. 9, 2016, now U.S. Pat. No. 9,589,868, entitled "Packaging Solutions for Devices and Systems Comprising Lateral GaN Power Transistors"; U.S. patent application Ser. No. 15/064,955, filed Mar. 9, 2016, now U.S. Pat. No. 9,589,869, entitled "Packaging Solutions for Devices and Systems Comprising Lateral GaN Power Transistors"; and U.S. patent application Ser. No. 15/197,861, filed Jun. 30, 2016, now U.S. Pat. No. 9,824,949, entitled "Packaging Solutions for Devices and Systems Comprising Lateral GaN Power Transistors".

The above referenced patents disclose examples of "embedded packaging" in which the GaN die is embedded in a dielectric package body, e.g.: a dielectric polymer resin composition, such as a plastic encapsulation material or a glass fiber epoxy composite, such as FR4 type materials, or a ceramic composite material. Conductive interconnects through the dielectric layers are provided e.g., by copper traces, posts and vias, that provide low inductance interconnections to external contact pads (lands) for source, drain and gate connections. In some types of encapsulated packaging, the GaN die is embedded by overmolding or injection of a polymer dielectric material around the die and conductive interconnect materials. Alternatively, the dielectric body of laminated packaging for embedded GaN dies may be built up from layers of dielectric materials, e.g. as described in Application Note GN002 entitled "Thermal Design for GaN Systems' Top-side cooled $GaN_{PX}$®-T packaged devices" (30 Oct. 2018 GaN Systems Inc.). This type of laminated packaging provides low parasitic inductance in compact (i.e. small form factor) package for high voltage, high current GaN e-HEMTs. For example, a 100V, 90 A GaN e-HEMT (GS61008T) may be provided in a top-side cooled laminated package which is about 7 mm×4 mm, and 0.54 mm thick; a 650V, 60 A GaN e-HEMT (GS66516T) may be provided in a laminated package which is 9 mm×7.6 mm and 0.54 mm thick.

The dielectric polymer resin composition forming laminated packaging may include laminate sheets and layers of composite material referred to as prepreg, which is a substrate material, such as woven or non-woven glass-fiber cloth, that is pre-impregnated with one or more polymer materials, such as a dielectric epoxy composition. The dielectric epoxy composition may comprise an epoxy resin, curing agents, additives, such as fire retardants, and fillers and other substances to modify properties of the resulting composite material. The epoxy laminate and prepreg layers are cut to form a cavity for the semiconductor die, and the layers are assembled as a stack and bonded together, e.g. in a curing process using heat and pressure, to form a dielectric body of the package in which the semiconductor die is embedded.

A wide range of different dielectric polymer resin compositions, e.g. epoxy laminate and prepreg materials, are commercially available and widely used for semiconductor device packaging. Materials systems for dielectric epoxy compositions fabricated from glass fibers and cured dielectric epoxy resins are well characterized with respect to thermo-mechanical and thermo-chemical properties and curing processes. For example, specification sheets may list properties such as glass transition temperature (Tg), coefficient of thermal expansion (CTE), flexural modulus, water absorption, dielectric constant, et al., which are evaluated according to industry standard test methods. By way of example, laminate and prepreg materials may be classed by their suppliers as high Tg, high or low elastic modulus, high or low CTE, halogen-free, et al. The use of these types of dielectric materials for laminated/embedded packaging for semiconductor devices for reliable long term operation at lower voltage and lower temperatures is well established. Package design consideration for low inductance interconnect and thermal dissipation are also well understood.

GaN power switching devices, such as those mentioned above offered by GaN Systems Inc., which are embedded in a $GaN_{PX}$ type laminated package of small size, e.g. e.g. 7 mm×5 mm and 0.5 mm thick, are capable of operation at voltages in a range from 100V to 650V, for switching currents of tens or hundreds of Amps. Operating temperatures may reach or exceed 100 C. For small size dies having a high current capability per unit active area, and smaller package sizes, e.g. chip-scale packaging, package components are therefore subjected to higher electric fields and higher operating temperatures than for low voltage, lower power switching devices.

It is known that some dielectric epoxy-based materials systems are susceptible to degradation when subjected to high electric fields, especially at elevated operating temperatures. This reliability issue presents a challenge when selecting dielectric epoxy materials for embedded packaging of high voltage/high current GaN e-HEMT power switches, that operate at high voltages and high temperatures, where high voltages combined with small geometry dies and packages result in components being subject to high electric fields. In seeking suitable dielectric materials for improved reliability for operation at high voltages, e.g. for GaN HEMTs operating in the range from 100V to 650V, and operating temperatures ≥100 C, the inventor has become aware that long term reliability issues resulting from degradation at high electric field and high temperature of commonly used epoxy materials are not well understood. There is a need for alternative or improved materials systems and test and design approaches for fabrication of embedded packaging of power switching devices, that extend reliable operation for at least one of higher operating temperature, higher voltage operation, and smaller geometry designs for more dense packaging and lower cost.

In particular, there is a need for improved or alternative packaging for high voltage/high current power semiconductor devices, such as GaN HEMTs, that provides improved reliability for high voltage and high temperature operation.

SUMMARY OF INVENTION

The present invention seeks to provides improved or alternative packaging for wide-bandgap semiconductor power devices, such as GaN HEMTs and SiC power MOSFETS, and a test and design methodology, which mitigate or circumvent at least one of the above-mentioned issues.

A first aspect of the invention provides a power semiconductor device comprising: a package comprising a dielectric body;
a power semiconductor die embedded in the dielectric body of the package;
the power semiconductor die being rated for operation with at least one of a rated operating voltage ≥100V and a rated operating temperature ≥100 C, wherein, the dielectric body comprises a dielectric polymer composition that provides a conductivity less than a reliability threshold value of conduction for the rated operating voltage and temperature.

For example, a power semiconductor device comprises:
a package comprising a dielectric body;
a semiconductor die embedded in the dielectric body of the package;
the semiconductor device being rated for at least one of an operating voltage V≥100V and operating temperature T≥100 C, wherein the dielectric body comprises a polymer resin composition characterised by:
  a conduction transition temperature Tc,
  a first (low temperature) activation energy $Ea_{Low}$ for conduction in a first temperature range below Tc,
  a second (high temperature) activation energy $Ea_{High}$ for conduction in a second temperature range above Tc; and
    the polymer composition having values of Tc, $Ea_{Low}$, and $Ea_{High}$ that provide a conductivity less than a specified reliability threshold value of conduction for the rated operating voltage and operating temperature.

The values of Tc, $Ea_{Low}$, and $Ea_{High}$ are determined from measurements of leakage current or conduction as a function of temperature and voltage for a sample of the dielectric polymer composition, e.g. having dimensions similar to the dielectric body of the package for a power semiconductor die, such as a GaN on silicon die carrying a GaN e-HEMT, which is rated for a specific operating voltage, e.g. 100V or 650V, and an operating temperature of e.g. ≥100 C or >150 C.

For example, the dielectric polymer composition is an epoxy composition, which may be a laminated epoxy composition. Alternatively, the polymer composition may be a polyimide composition or other type of dielectric polymer composition.

For example, for a package body comprising a laminated epoxy composition, the specified reliability threshold for conduction at an operating voltage of 100V and an operating temperature of 150 C may be set at less than $2\times10^{-13}$ S/cm, and preferably less than $5\times10^{-14}$ S/cm. For example, this may correspond to a leakage current at 150 C of less than $3\times10^{-8}$ A/cm$^2$, or preferably less than $3\times10^{-9}$ A/cm$^2$.

The first (low temperature) activation energy $Ea_{Low}$ is selected to be less than a specified first threshold activation energy, which is close to zero, e.g. ≤0.5 eV, and preferably ≤0.2 eV. Where Tc is greater than the rated operating temperature, any increase in conduction over the operating temperature range will be determined by $Ea_{Low}$. Thus, selection of an epoxy laminate composition having a high Tc, greater than the operating temperature and small value of $Ea_{Low}$ will maintain conduction below the required reliability threshold.

If the Tc is above the rated operating temperature, conduction at temperatures above Tc will be determined by $Ea_{High}$. If the value of $Ea_{High}$ is high, conduction will increase rapidly with temperature above Tc. It is therefore desirable that the second (high temperature) activation energy $Ea_{High}$ is less than a specified second threshold activation energy, e.g. ≤1 eV, or preferably less than 0.75 eV, to maintain the conduction below the required reliability threshold.

Where there is a sharp transition from a low temperature conduction region to a high temperature conduction region, Tc is well defined. Thus, a laminate epoxy composition having appropriate values of Tc, $Ea_{Low}$, and $Ea_{High}$ that maintain conduction below the reliability threshold up to the maximum operating temperature is selected.

The power switching device may comprise a lateral GaN power transistor, for example, a lateral GaN e-HEMT rated for 100V operation or 650V operation. Alternatively, the power switching device may comprise a SiC MOSFET or a Si IGBT or a diamond power MO SFET.

Another aspect of the invention provides a semiconductor device comprising:
a package comprising a dielectric body;
a power semiconductor die comprising a power transistor switch embedded in the dielectric body of the package with electrical connections extending to external source, drain and gate contact areas of the package,
the power transistor switch being rated for an operating voltage V≥100V and an operating temperature T≥100 C wherein, the dielectric body comprises a polymer resin composition characterised by:
  a conduction transition temperature Tc,
  a first (low temperature) activation energy $Ea_{Low}$ for a first temperature range below Tc,
  a second (high temperature) activation energy $Ea_{High}$ for a second temperature range above Tc; and wherein the values of Tc, $Ea_{Low}$, and $Ea_{High}$ provide a conductivity (S/cm) less than a reliability threshold value of conduction for the rated operating voltage and temperature of the power transistor switch.

For example, the dielectric polymer composition that forms the dielectric body of the package is a laminated epoxy composition, and electrical connections comprise copper.

In some embodiments, the power switching device comprises a lateral GaN power transistor, e.g. a high current lateral GaN e-HEMT which is rated for operation up to 100V, or for operation up to 650V.

For example, in some embodiments, the epoxy composition is selected to provide a reliability threshold for conduction $\leq 2\times10^{-13}$ S/cm, or preferably $\leq 5\times10^{-14}$ S/cm, and to provide leakage $\leq 3\times10^{-8}$ A/cm$^2$, and preferably $\leq 3\times10^{-9}$ A/cm$^2$. For example, to stay below these thresholds, the first activation energy $Ea_{Low}$ is a specified first threshold activation energy of $\leq 0.2$ eV and the second activation energy $Ea_{High}$ is a specified second threshold activation energy of $\leq 1$ eV. The conductivity transition temperature Tc is preferably high, e.g. $\geq 100$ C or $\geq 150$ C.

Where Tc is greater than the rated operating temperature, $Ea_{Low}$ has a low value, e.g. $\leq 0.2$ eV that maintains the conduction below the reliability threshold.

Where Tc is less than the rated operating temperature, $Ea_{Low}$ has a low value, e.g. $\leq 0.2$ eV, and $Ea_{High}$ has a value, e.g. $\leq 1$ eV, and more preferably $\leq 0.75$ eV to maintain the conduction below the reliability threshold.

Also provided is a method of characterizing dielectric polymer compositions for use in packaging of power semiconductor devices for high voltage, high temperature operation, comprising:
providing a test sample;
for each of a set of temperatures, applying an electric field (V/cm) over a range of operating values and measuring a leakage current (A) as a function of electric field;
from said data, for a specified operating voltage V of the power semiconductor device, generating values of ln (Conduction) vs. q/kT, and from the gradient of ln (Conduction vs. q/kT obtaining values of:
   a conduction transition temperature Tc,
   a low temperature activation energy EaLT for the first range of operating temperatures below Tc,
   a high temperature activation energy Earn' for the second range of operating temperatures above Tc.

Since local electric fields are dependent on package geometry and interconnect structure, providing a test sample comprises providing a sample of the laminated dielectric composition having dimensions (e.g. length (x), width (y) and thickness (z) dimensions) commensurate with a semiconductor package to be fabricated, or providing a packaged die for testing.

The method may further comprise, for a said specified operating voltage V and operating temperature T of the power semiconductor device, assessing whether the dielectric polymer composition meets a reliability threshold for conduction. For example, for a package body comprising a laminated epoxy composition, the reliability threshold for conduction at an operating voltage of 100V and an operating temperature of 150 C may be set at less than $2\times10^{-13}$ S/cm, and preferably less than $5\times10^{-14}$ S/cm, which may correspond to a leakage current at 150 C of less than $3\times10^{-8}$ A/cm$^2$, or preferably less than $3\times10^{-9}$ A/cm$^2$.

For example, to meet a required reliability threshold for conduction, it may be specified that the conductivity transition temperature is at or above the rated operating temperature, and the low temperature activation energy $Ea_{Low}$ is less than a specified first threshold activation energy, which is close to zero, e.g. $\leq 0.5$ eV, and more preferably $\leq 0.2$ eV. Where Tc is less than the rated operating temperature, it may be specified that the high temperature activation energy $Ea_{High}$ is less than a specified second threshold activation energy, e.g. $\leq 1$ eV, or preferably less than 0.5 eV, to maintain the conduction below the reliability threshold for temperatures above Tc.

Where conduction characteristics as a function of electric field and temperature comprising values of Tc, $Ea_{Low}$ and $Ea_{High}$ are provided for a plurality of different polymer resin compositions, ranking of the polymer resins by these conduction characteristics is possible, to assist in selecting appropriate polymer resin compositions to meet a required reliability threshold of conduction. For example, in a fully cured dielectric polymer composition, such as a dielectric epoxy composition or a dielectric epoxy laminate composition, the low temperature activation energy $Ea_{LT}$ would ideally be close to zero, or very low. In practice the low temperature activation energy $Ea_{LT}$ is selected to be $\leq 0.5$ eV, preferably $\leq 0.2$ eV, and more preferably $\leq 0.1$ eV. Preferably, the conductivity transition temperature is higher than the specified maximum operating temperature, or close to the maximum operating temperature so that conduction is primarily determined my $Ea_{LT}$. If the conductivity transition temperature Tc is less than the specified maximum operating T, it is also required that the high temperature activation energy EaHT does not exceed a required threshold value, e.g. is $\leq 1$ eV, or more preferably $\leq 0.5$ eV, because conduction above Tc contributes more significantly to leakage current. For example, for operation $\geq 100$V at an operating temperature of 100 C, it is desirable that the dielectric polymer material has a Tc above 100 C, preferably 150 C, and EaLT is <0.2 eV. If, for example, Tc is at least 70 C or 80 C, then $Ea_{HT}$ is preferably less than 0.5 eV. For example, by appropriate selection of these parameters, the conductivity at 150 C is less than $2\times10^{-13}$ S/cm, preferably less than $5\times10^{-14}$ S/cm, and more preferably less than $1\times10^{-14}$ S/cm.

This test methodology provides for characterizing dielectric polymer materials, such as dielectric epoxy laminate materials, for semiconductor device packaging, to facilitate selection of an appropriate dielectric materials system, providing a design approach that extends reliable operation for at least one of higher operating temperatures, higher operating voltage, and to support smaller geometries for more dense packaging and lower cost.

Thus, embodiments of the invention provides for improvements in embedded packaging for power semiconductor devices, such as high voltage power switching devices comprising e.g. GaN HEMTs, SiC MOSFETs and SiIGBTs, operating at elevated temperatures, and a test methodology for assessing electrical conduction characteristics of dielectric polymer compositions for embedded packaging, for improved device performance and reliability.

BRIEF DESCRIPTION OF THE DRAWINGS

FIG. 16 shows a table of experimental data obtained for samples of some exemplary epoxy laminate materials;

The foregoing and other objects, features, aspects and advantages of the present invention will become more apparent from the following detailed description, taken in conjunction with the accompanying drawings, of embodiments of the invention, which description is by way of example only.

DETAILED DESCRIPTION

Examples of embedded packaging device structures comprising a laminated dielectric package body containing a lateral GaN power transistor are shown schematically in FIGS. 1 to 6 (Prior Art).

Figure 1:
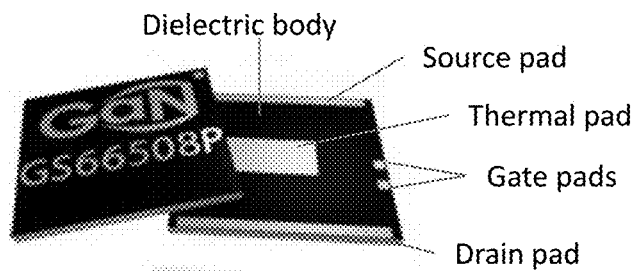
FIGS. 1 to 3 (Prior Art) shows schematic views of an example of an E-mode GaN HEMT device structure embedded in a laminated epoxy package with bottom-side cooling.
Figure 2:
Figure 3:
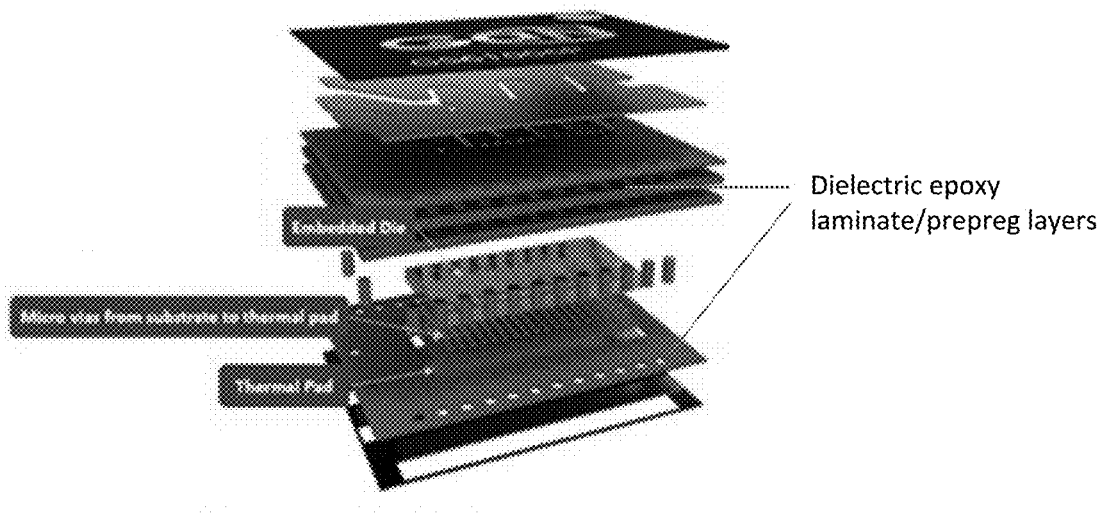

FIG. 1 shows top-side and bottom-side views of a first example of a package comprising an embedded GaN-on-Si die comprising a 650V lateral GaN e-HEMT. The back-side of the package comprises a thermal pad, and source, drain and gate contact pads. FIG. 2 shows a simplified schematic cross-sectional view through the package showing the embedded die and packaging components. FIG. 3 shows an exploded view of the components of the package, to illustrate how the GaN-on-silicon die is embedded within a dielectric body of the package which comprises an epoxy composition fabricated from laminations comprising several epoxy laminate and prepreg layers. The GaN die comprises a thick copper redistribution layer (RDL) defining large area source, drain and gate contact areas, and a thermal pad. Other components comprise low inductance conductive copper interconnects comprising copper filled vias, copper filled micro-vias, and external source, drain and gate pads.

Figure 4:
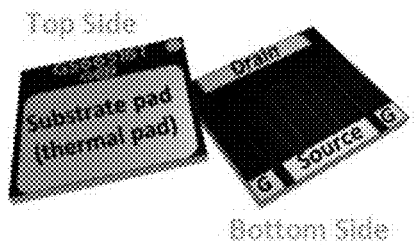
FIGS. 4 to 6 (Prior Art) shows schematic views of another example of an E-mode GaN HEMT device structure embedded in a laminated epoxy package with top-side cooling.
Figure 5:
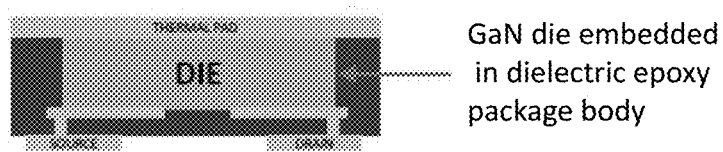
Figure 6:
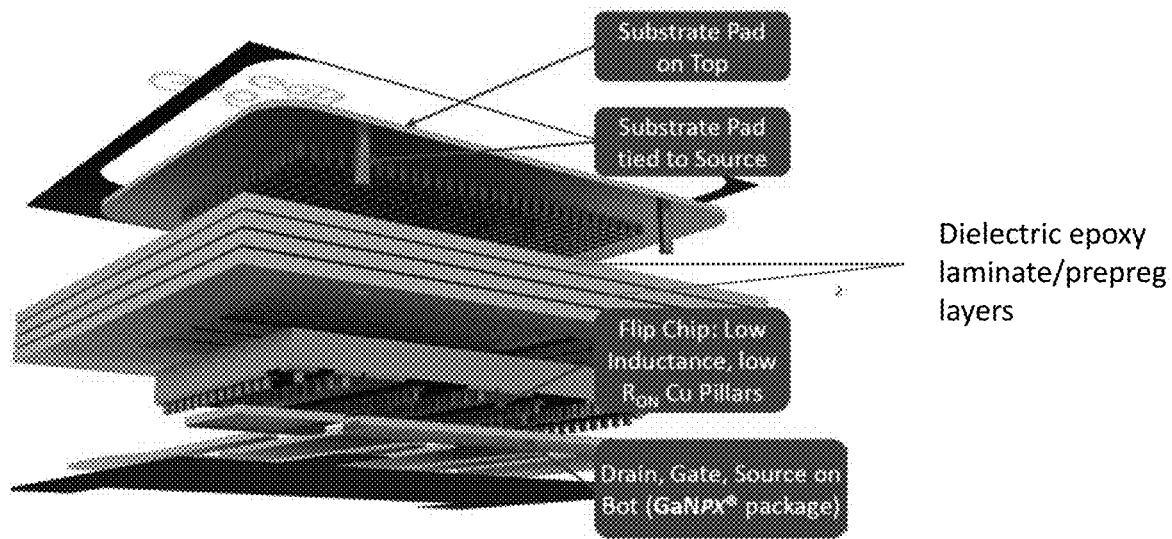

FIG. 4 shows top-side and bottom-side views of another example of a package comprising an embedded GaN-on-Si die comprising a GaN e-HEMT. The front side of the package comprises a thermal pad. Source, drain and gate pads are provided on a back-side of the package. FIG. 4 shows a simplified schematic cross-sectional view through the package showing the embedded die and packaging components with the thermal pad on top. FIG. 5 shows an exploded view of the components of the package, which shows how the GaN die is embedded in a dielectric package body comprising laminations of several epoxy laminate/prepreg layers, with the copper thermal pad and thermally conductive copper filled micro-vias, and electrically conductive copper interconnects comprising low inductance copper filled vias and external source, drain and gate pads.

The fabrication process for this type of embedded component package is based, for example, on the AT&S ECP® and Centre Core ECP® $^{processes}$. The package is fabricated by placing each GaN die in a cavity within a stack of layers, comprising epoxy laminate/prepreg, and curing the epoxy laminate composition so that the GaN die is embedded in a solid dielectric body. The electrical connections to the GaN die are formed in subsequent steps, e.g. by drilling micro-vias and through-substrate vias, which are then filled with plated copper, to form low inductance electrical interconnections. Copper filled micro-vias provide a thermal connection from the back-side of the die to the thermal pad.

Since these packages are small in size, e.g. ~10 mm×~5 mm and about 0.5 mm thick, for operation at high voltages, e.g. at 100V or 650V, the dielectric body of the package, i.e. comprising the epoxy laminations, is subjected to high electric fields during operation. Conventional lower cost epoxy materials, e.g. FR4 type epoxy materials containing halogens as flame retardants, are susceptible to degradation under high electric fields, particularly at higher operating temperature. For example, degradation may be observed in the form of corrosion of copper contacts caused by migration of halogen ions, such as chlorine or bromine.

Package design considerations for low inductance interconnect and thermal dissipation are well understood, and the thermo-mechanical properties of epoxy materials systems for laminated packaging are well characterized, by industry standard test methods, so that appropriate epoxy materials can be selected based on parameters such as Tg, CTE, et al., that are reported on materials specification sheets. Thus, appropriate epoxy laminates and prepregs for laminated packaging may be selected based on these parameters, e.g. to optimize thermal and mechanical performance. The specified parameters may include electrical parameters including dielectric constant (Dk) and dissipation factor (Df) at a specified frequency or frequencies, resistivity, and surface resistance. However, in seeking suitable materials for packaging power switches comprising GaN e-HEMTs operating at ≥100V or ≥650V, it has become apparent that the performance of dielectric epoxy materials systems under high electric fields, particularly at higher operating temperatures, is not well characterized or understood. Specification sheets and standard test methods for epoxy composite materials for laminated packaging do not report other parameters that would assist in selecting dielectric materials systems that are optimized for high voltage and high temperature operation of embedded power devices, particularly where a package of small dimensions results in the dielectric materials of the package being subject to high electric fields, e.g. in a range of ~10$^3$V/cm to 10$^5$V/cm. Thus, for high voltage and high temperature operation, selection of appropriate epoxy materials systems, or other suitable dielectric materials systems, for laminated packaging has been based, in part, on trial and error. It will also be apparent that, for a specified operating voltage and operating temperature, in practice, the electric field experienced by the dielectric material of the package is dependent on, or influenced by, factors such as the size and geometry of the package body, and the size and layout of the die and conductive interconnect structure.

Disclosed herein is a test methodology for assessing the performance of dielectric polymer materials, such as epoxy composite materials systems, for fabrication of embedded packaging, including laminated packaging, of power semiconductor devices that operate at high voltages and high currents, and at elevated operating temperatures. This test methodology is based on measurements of leakage current (A/cm$^2$) as a function of electric field and temperature, that provides parameters comprising a conductivity transition temperature Tc, and first and second activation energies, $Ea_{Low}$ and $Ea_{High}$, where $Ea_{Low}$ is for conduction in a first temperature range below Tc, and $Ea_{High}$ is for conduction in a second temperature range above Tc. The conductivity transition temperature Tc, and the first and second activation energies, $Ea_{Low}$ and $Ea_{High}$ can be used to rank materials and assist in selecting appropriate dielectric materials for embedded packaging. As an example, the method is described for selecting materials comprising dielectric epoxy compositions for laminated packaging of power semiconductor devices, such as GaN e-HEMTs, that operate at high voltage and high current, resulting in higher operating temperatures than typical for low power and low voltage semiconductor devices, and resulting in exposure to higher electric fields than for low power semiconductor devices.

Test Methodology

Test samples of laminated epoxy dielectric materials having dimensions typical of the size of packaged GaN HEMTs shown in FIGS. 1 to 6, embedded between copper electrode layers were obtained. For each sample, an electric field was applied in the Z direction, i.e. across the thickness of the sample, and a series of measurements of the leakage current (A) vs. electric field (V/cm) were made for temperatures in a range of 0 C to 200 C, and for electric fields in the range from 0V/cm to over 10$^5$V/cm. In an embodiment, the sample was connected to a computer controlled power supply and placed into a temperature controlled environment. A temperature was selected and after the sample stabilized or came into thermal equilibrium, the power supply voltage was swept from 0V to 650V in 5V steps and the total current was measured at each bias point.

Figure 7:
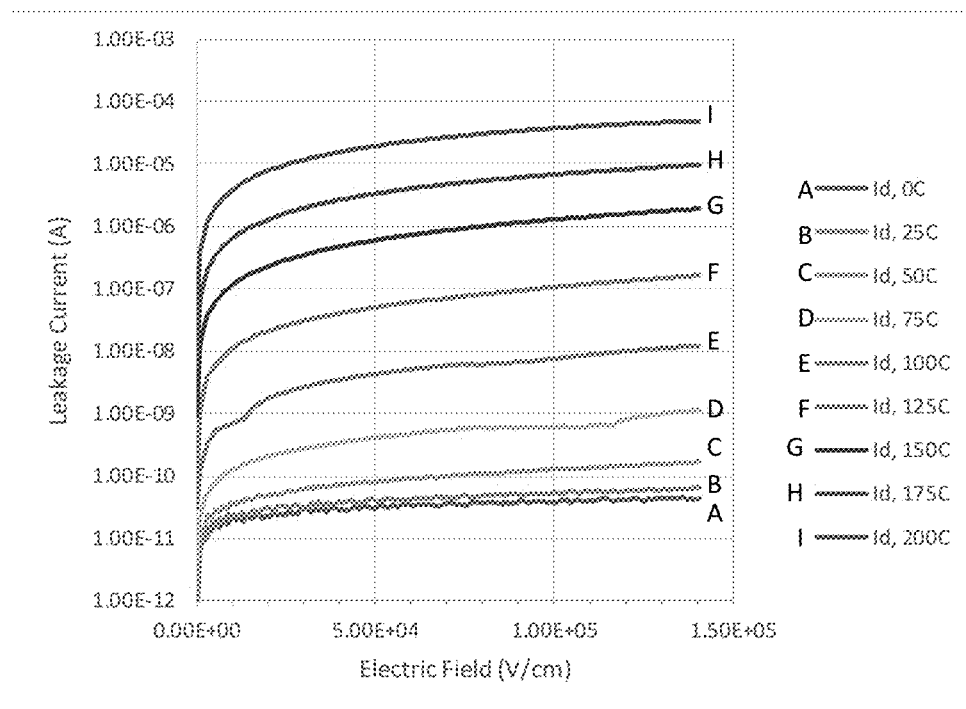
FIG. 7 shows an example of plots of Leakage Current (A) vs. Electric Field (V/cm), for temperatures in the range 0 C to 200 C, for a sample of a laminated epoxy dielectric material.

For example, FIG. 7 shows an example of plots of Leakage Current (A) vs. Electric Field (V/cm), for temperatures in the range 0 C to 200 C, for one sample of a laminated epoxy material. The leakage current increases with electric field and temperature.

Figure 8:
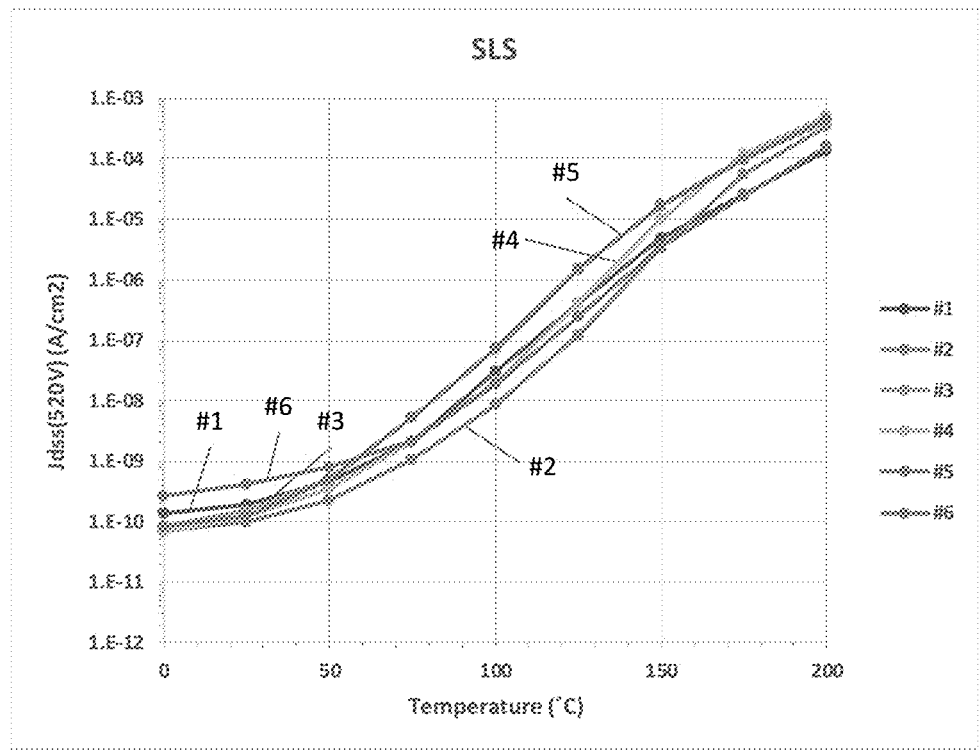
FIG. 8 shows an example of plots of Conduction Jdss (A/cm$^2$) at 520V vs. Temperature for six samples of laminated epoxy dielectric material.

FIG. 8 shows an example of plots of conduction Jdss (A/cm$^2$), for an applied voltage of 520V, for six samples of laminated epoxy material which are cured to the Soft Lamination Stage (SLS). There is a non-linear increase in Jdss with temperature.

Figure 9:
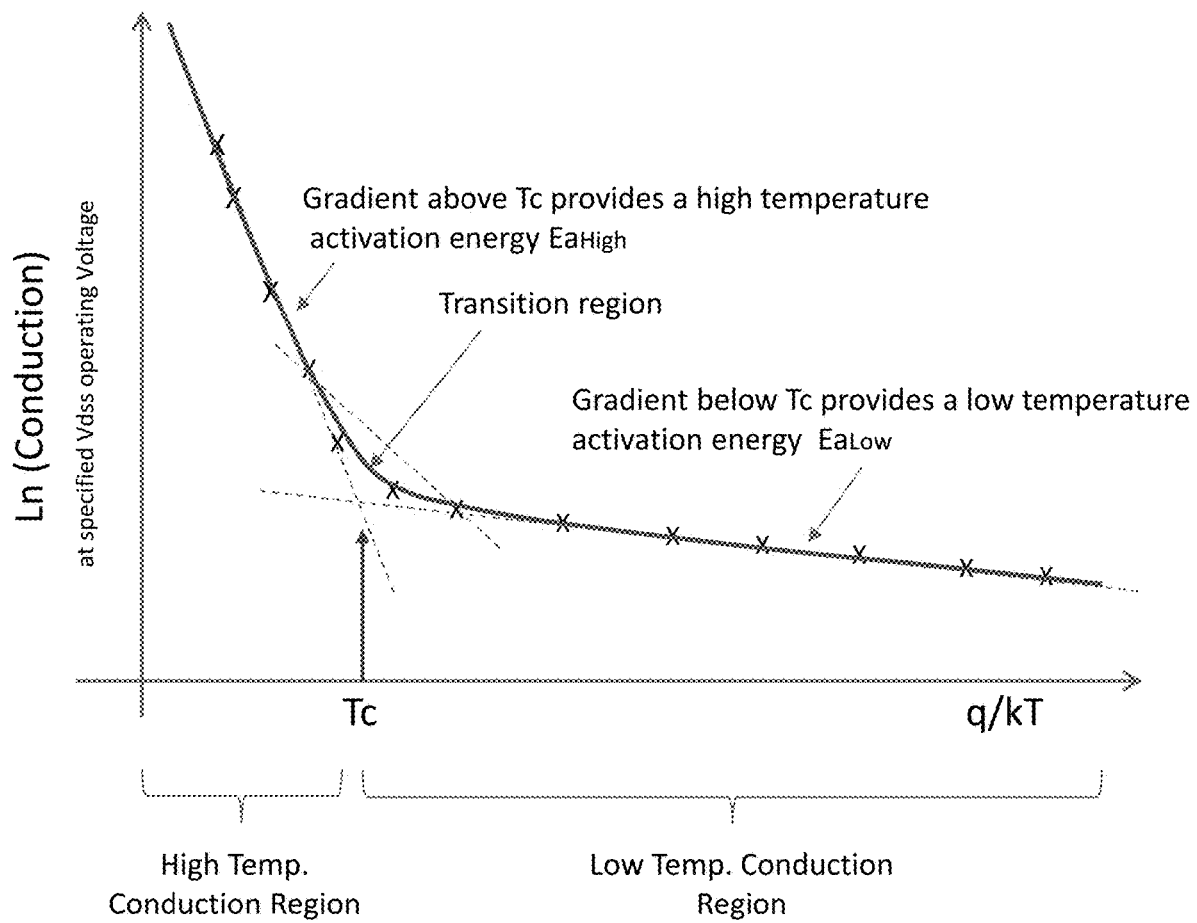
FIG. 9 shows a schematic example of an Arrhenius type plot of the natural log of the conduction Ln(Conduction) vs. q/kT for a sample of laminated epoxy material to determine a conductivity transition temperature Tc, and activation energies $Ea_{LOW}$ and $Ea_{HIGH}$ for high and low temperature operating regimes.

FIG. 9 shows a schematic Arrhenius type plot of data for one sample, which is a plot of the natural logarithm of the conduction, Ln(Conduction) against q/kT, wherein T is the temperature in Kelvin, q is the electron charge 1.602×10$^{-19}$ C, and k is the Boltzmann constant, for determining activation energies in eV. The slope of the plot of Ln(J) vs. 1/t is used to obtain an activation energy, in eV, for conduction for different temperature ranges.

As illustrated schematically in FIG. 9, for the samples tested, it was observed that the conduction shows a distinct transition between a low temperature conduction region and high temperature conduction region. Activation energies for the low temperature conduction region and high temperature conduction region are determined from gradient of each region of the plot of Ln(J) vs 1/T, as shown. The sample epoxy laminate compositions exhibit two conduction modes, with a first activation energy $Ea_{Low}$ over a first (lower) temperature conduction range and a second activation energy $Ea_{High}$ over a second (higher) temperature conduction range, and a transition region between the two. The transition point is referred to as the conductivity transition temperature, Tc, and marks a change in conduction mechanism as the temperature is increased.

Figure 10A:
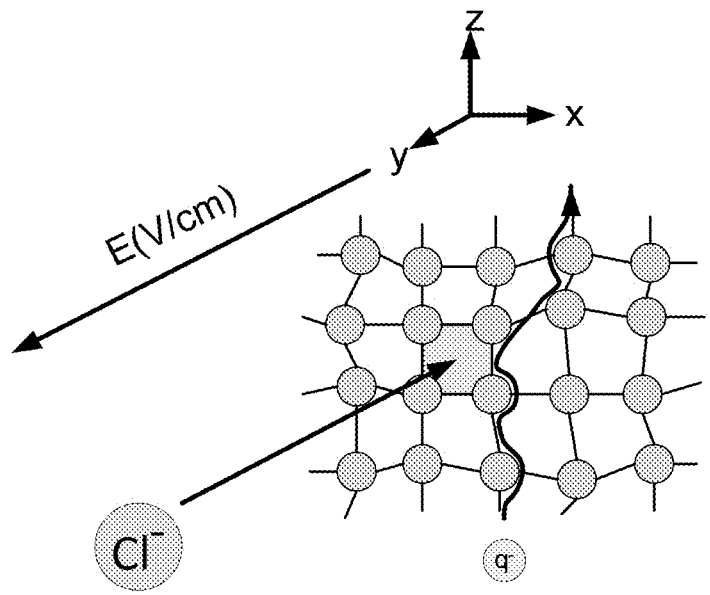
FIG. 10A shows a schematic diagram of a cross-linked polymer network for conduction at low temperature.
Figure 10B:
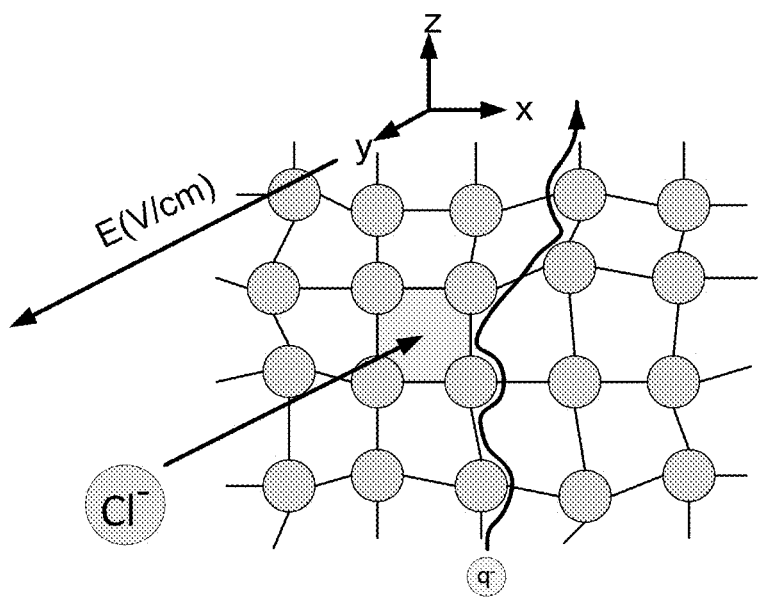
FIG. 10B shows a schematic diagram of a cross-linked polymer network for conduction at high temperature.

FIGS. 10A and 10B show schematic representations of a cross-linked epoxy polymer network at first and second temperatures to illustrate conduction under a high electric field for a low temperature conduction regime and a high temperature conduction regime. Without wishing to be limited by theory, the following is believed to provide a possible explanation of the conductivity transition from a low temperature conduction region below Tc to a high temperature conduction region above Tc.

Low Temperature Conduction

Low temperature conduction in dielectric epoxy compositions ("epoxy") is due to electrons associated with the cross-linking of the cured epoxy. At low temperatures with fully cured epoxy there is a dense network of cross-linking of the epoxy molecules, with a full valance band. This situation should define a good insulator with very little current flow. Due to the nature of organic epoxies not all of these cross-linking molecules are linked, and shallow traps or defects are formed. When a bias is applied a small leakage current flows and the temperature dependence of the current flow is due to the shallow traps. These shallow traps result in a low activation energy, e.g. <0.5 eV or close to zero, for conduction in the low temperature regime, as illustrated by the smaller gradient in the low temperature region of the plot in FIG. 9.

As illustrated schematically in FIG. 10A, at lower temperatures the epoxy matrix is dense and atomic bond length is small, e.g. ~150 pm. Electron conduction can occur along atomic bonds. However, if additives such as a halogen are added for flame resistance, a halogen ion such as a chorine Cl$^-$ ion is large ~180 pm in diameter, and interstitial conduction is limited by the shaded area between atoms.

High Temperature Conduction

As the temperature is increased, the epoxy matrix starts to expand due to CTE, the density of the epoxy decreases. This is accompanied by an increase in leakage current for a fixed bias with increasing temperature. The higher temperature conduction is more dependent on temperature and the leakage currents can quickly grow. This region has a higher activation energy as illustrated by the steeper gradient of the plot in the high temperature conduction region of FIG. 9.

For a high voltage embedded power package an increase in current under high electric field at higher temperature represents a reliability issue. This issue is due to the damaging effect of hot electrons that are flowing through the epoxy, e.g. releasing unwanted hydroxyls, halogens and other impurities from the epoxy. To further improve the performance of epoxy at high temperatures and high applied voltages, dielectric fillers such as silica SiO$_2$ and alumina Al$_2$O$_3$ are used. These fillers are small and spherical in shape and have the effect of increasing the path length for any leakage current that might flow. Thus, as illustrated schematically in FIG. 10B, at high temperatures the epoxy matrix is less dense and atomic spacing is larger. Electron conduction can still occur along atomic bonds. However, ionic conduction is no longer limited by the shaded area between atoms and ions are free to move under an electric field.

Package Leakage Current

Dielectric polymer resin compositions, such as dielectric epoxy compositions, and dielectric epoxy laminate compositions, are known to contain many additives, e.g. fillers such as silica and alumina, flame retardants, and impurities, e.g. Br, Fe, etc. These impurities can be charged and drift under the applied operating electric field. For example, when $Cl^-$ ions reach a copper electrode in the package, corrosion of the copper can occur. This corrosion can result in the transport of $Cu^+$ ions back towards the cathode that can eventually result in a dielectric breakdown leading to reliability issues. For example, this type of copper corrosion has been shown to be proportional to the leakage current density in the epoxy composition. To reduce the copper corrosion or degradation of the epoxy, it is desirable to reduce the available leakage current at high temperatures and high voltages. By obtaining high temperature and high voltage conduction characteristics of epoxy materials, it is possible to define parameters Tc, $Ea_{Low}$ and $Ea_{High}$, that assist in making an appropriate choice of dielectric epoxy composition materials to maintain leakage currents below a reliability threshold.

The following example scenarios show how dielectric epoxy compositions having appropriate values of Tc, $Ea_{Low}$ and $Ea_{High}$ can be selected to maintain leakage current or conduction values below a specified reliability threshold, e.g. for corrosion free operation.

Example 1

Figure 11:
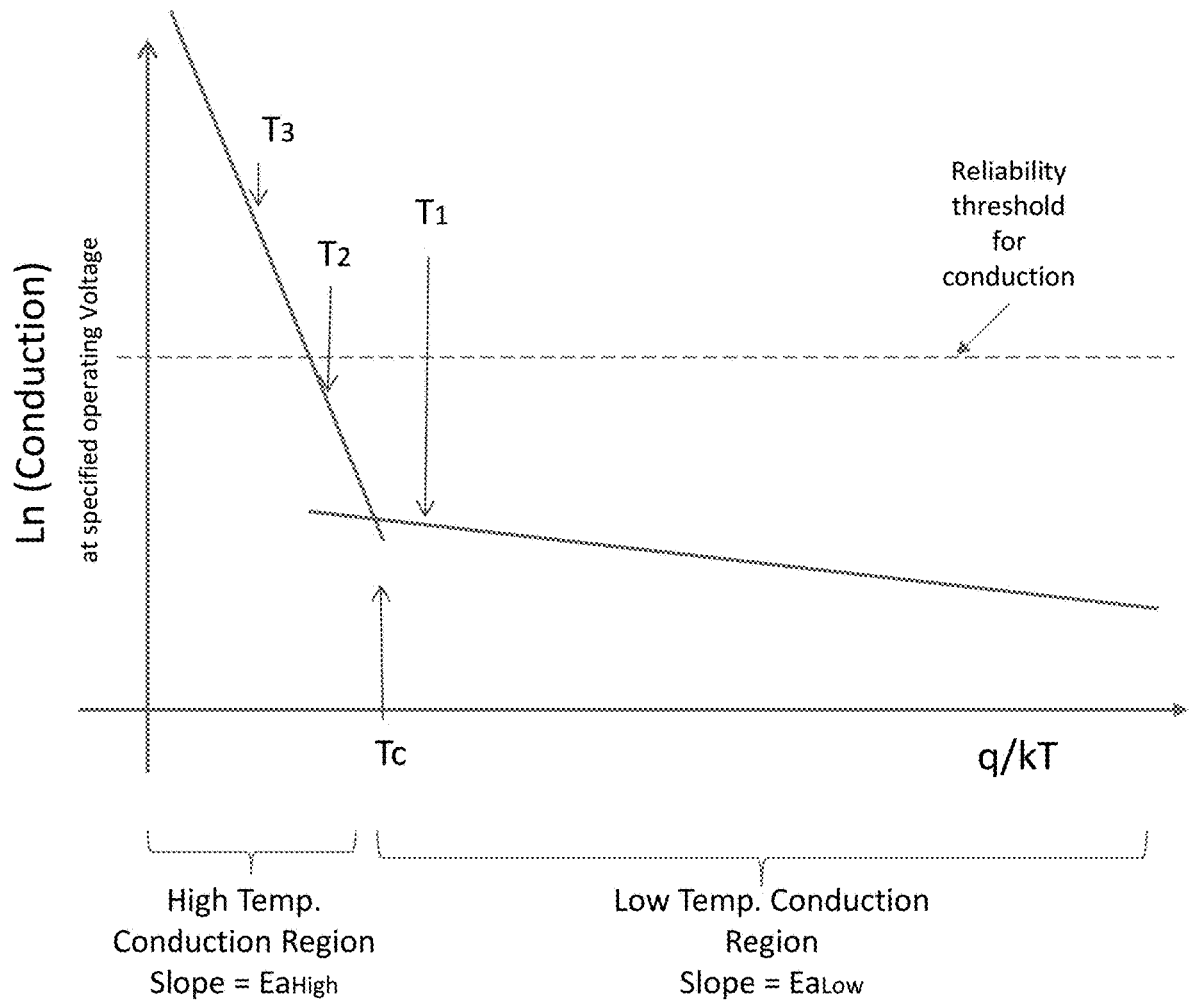
FIG. 11 shows a schematic plot of Ln (Conduction) vs. q/kT for a first example scenario.

FIG. 11 shows a schematic plot of Ln(conduction) vs. q/kT for a first example of a material in which there is a transition from a low temperature conduction region characterized by a first activation energy $Ea_{Low}$, below transition temperature Tc, to a high temperature conduction region characterized by a second activation energy above Tc. If for example, the required operating temperature is T1, where T1=150 C, Tc is higher than T1, and $Ea_{Low}$ is small, e.g. ≤0.5 eV or ≤0.2 eV, operation at temperatures below Tc maintains the conduction at a value well below a required reliability threshold for conduction, e.g. $3 \times 10^{13}$ S/cm. Above Tc, the conduction increases more rapidly with temperature, i.e. dependent on the second activation energy $Ea_{High}$, e.g. 1 eV. In this example, operation at T2 would be close to the reliability threshold for conductions, but falls in the region above Tc, where conduction increases rapidly with temperature above the reliability threshold, e.g. at T3. These characteristics imply that the epoxy material is appropriate for operation at the required operating voltage and temperatures ≤T1.

Example 2

Figure 12:
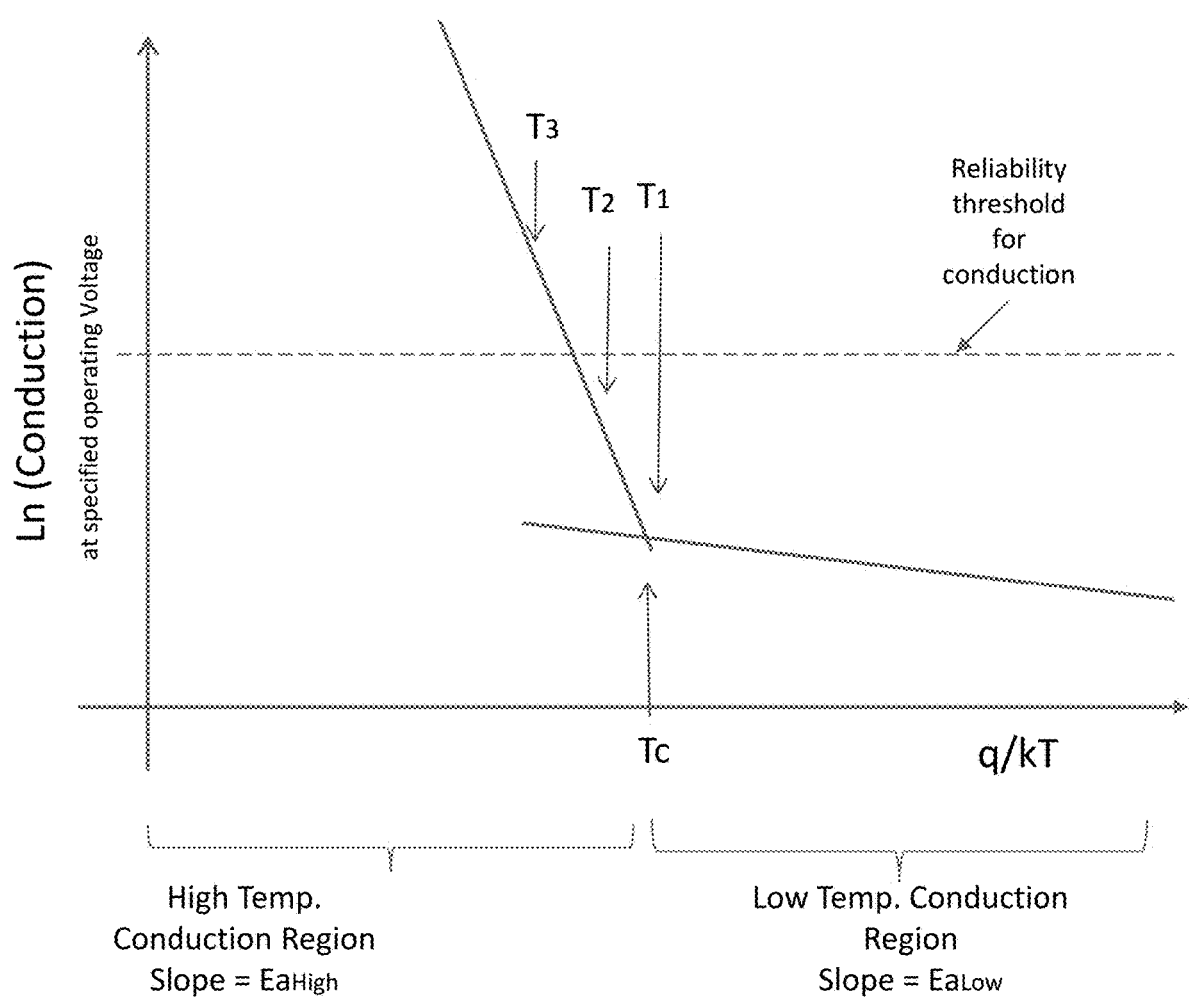
FIG. 12 shows a schematic plot of Ln (Conduction) vs. q/kT for a second example scenario.

FIG. 12 shows a plot of Ln(conduction) vs. q/kT for a second example of a material in which there is a transition from a low temperature conduction region characterized by a first activation energy $Ea_{Low}$, below transition temperature Tc, to a high temperature conduction region characterized by a second activation energy above Tc, in which Tc occurs at a lower temperature than for Example 1. $Ea_{Low}$ is small, e.g. ≤0.2, and operation at temperatures below Tc maintains the conduction at a value well below a required reliability threshold for conduction, e.g. $3 \times 10^{13}$ S/cm. However, since Tc is low, e.g. 50 C, conduction increases more rapidly with temperature above Tc, i.e. dependent on the second activation energy $Ea_{High}$, above Tc. Thus, reliable operation is restricted to temperatures below T1, and reliability is borderline for T2. This implies that this material would be suitable only for lower temperature operation at the specified operating voltage.

Example 3

Figure 13:
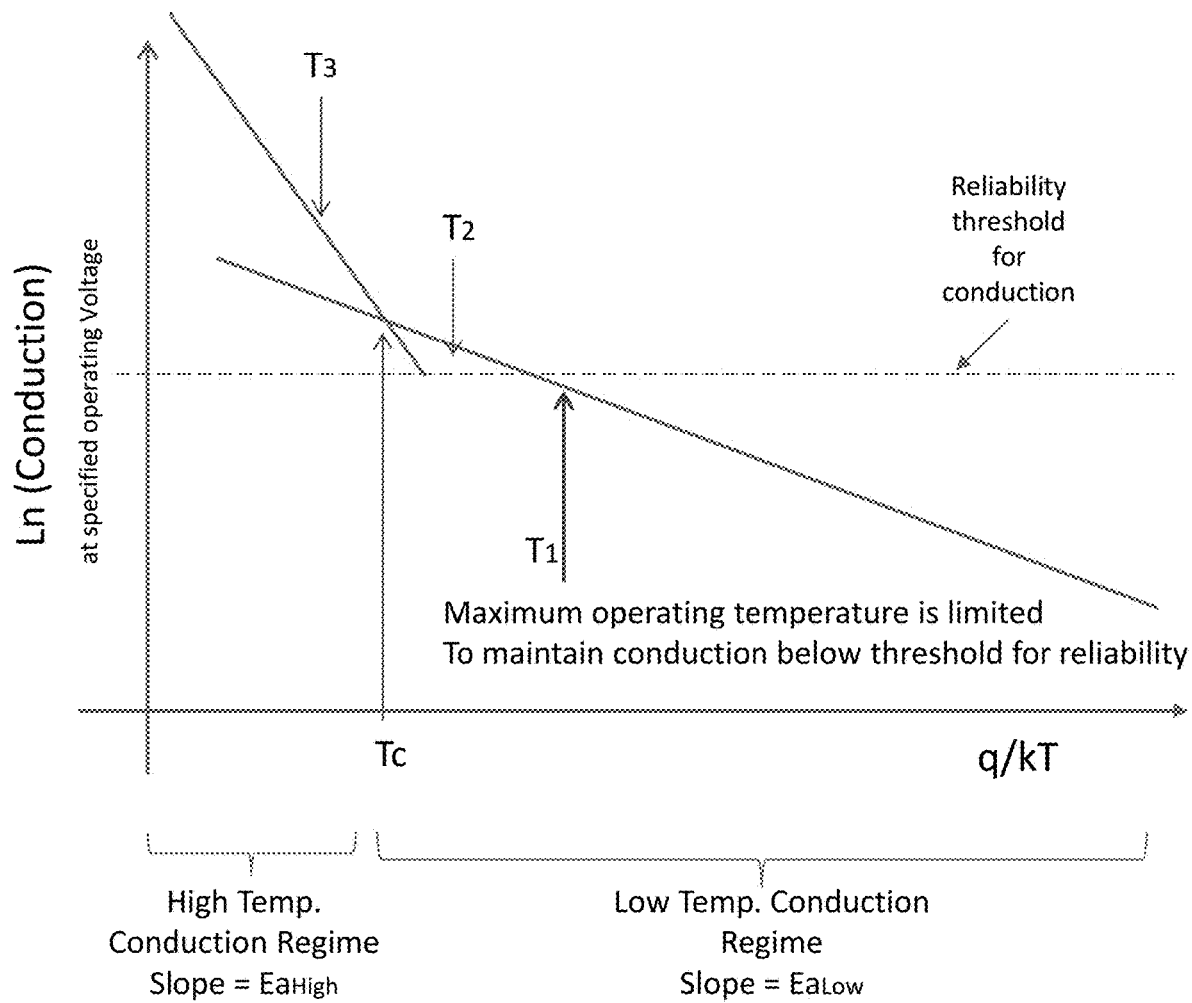
FIG. 13 shows a schematic plot of Ln (Conduction) vs. q/kT for a third example scenario.

FIG. 13 shows a plot of Ln(conduction) vs. q/kT for a third example of a material in which there is a transition from low temperature conduction region characterized by a first activation energy $Ea_{Low}$, below transition temperature a Tc, to a high temperature conduction region characterized by a second activation energy above Tc, in which Tc occurs at a high temperature, similar to Example 1. However, in this example $Ea_{Low}$ is larger, e.g. >0.5 eV, and as the temperature increases, the conduction exceeds the specified reliability threshold at temperatures below Tc. Thus, reliable operation is restricted to temperatures below T1. This implies that this material would be suitable only for lower temperature operation at the specified operating voltage.

Example 4

Figure 14:
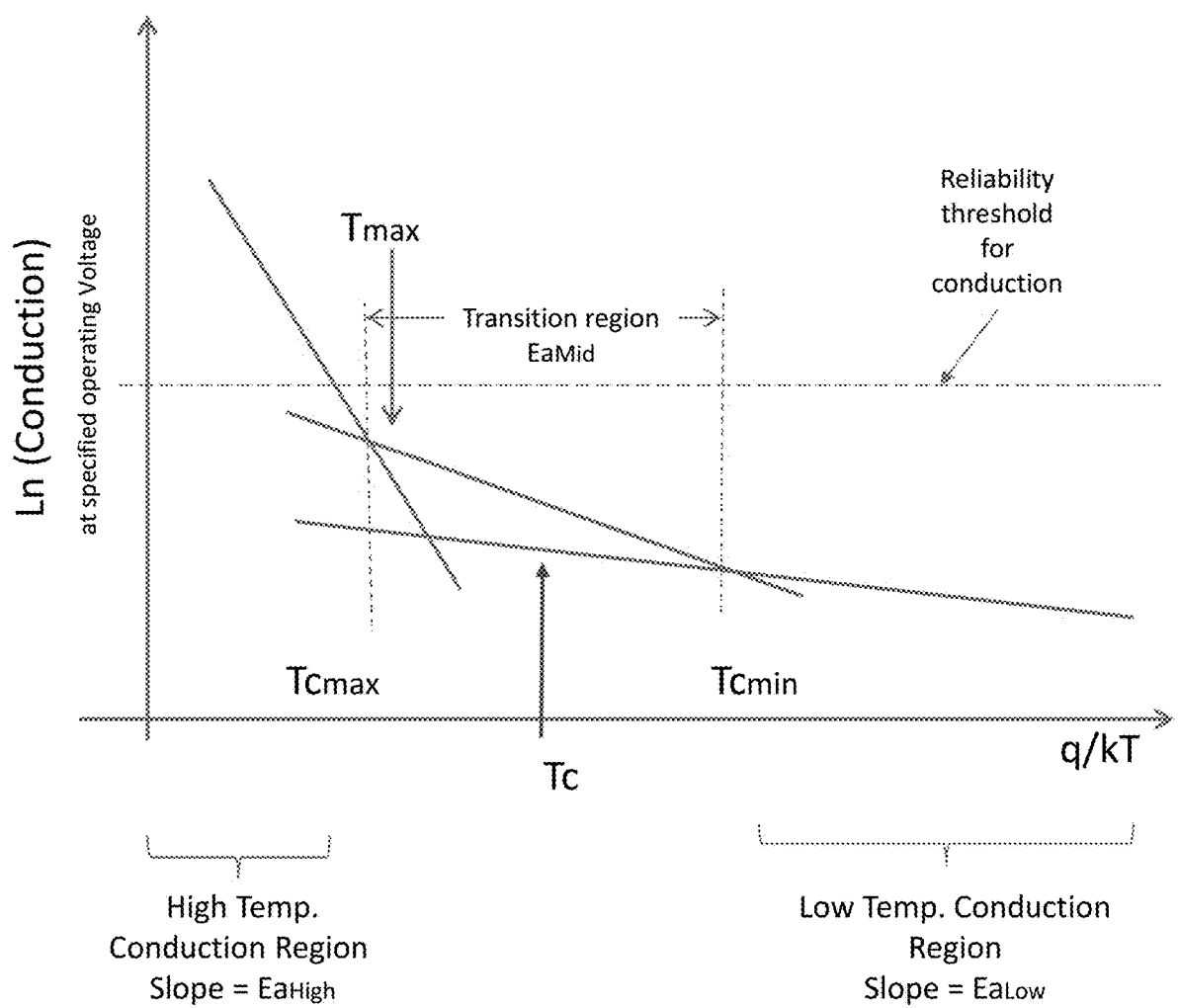
FIG. 14 shows a schematic plot of Ln (Conduction) vs. q/kT for a fourth example scenario.

FIG. 14 shows a plot of Ln(conduction) vs. q/kT for a fourth example of a material in which there is a transition from a low temperature conduction region characterized by a first activation energy $Ea_{Low}$, below transition temperature Tc, and a high temperature conduction region characterized by a second activation energy above Tc, in which the conductivity transition occurs over a larger conductivity transition range, between $Tc_{max}$ and $Tc_{min}$. For example, of Tc is defined in the middle of this range, and is e.g. 150 C, similar to Example 1. $Ea_{Low}$ is low, so that conduction increases slowly with temperature below $Tc_{min}$, and then increases more rapidly in the transition region. A maximum operating temperature Tmax, close to $Tc_{max}$ maintains conduction at a value below the required reliability threshold for conduction, e.g. $3 \times 10^{-13}$ S/cm. This example implies that this material would be suitable for reliable operation at the specified operating voltage for temperatures $T_{max}$ close to $Tc_{max}$.

Example 5

Figure 15:
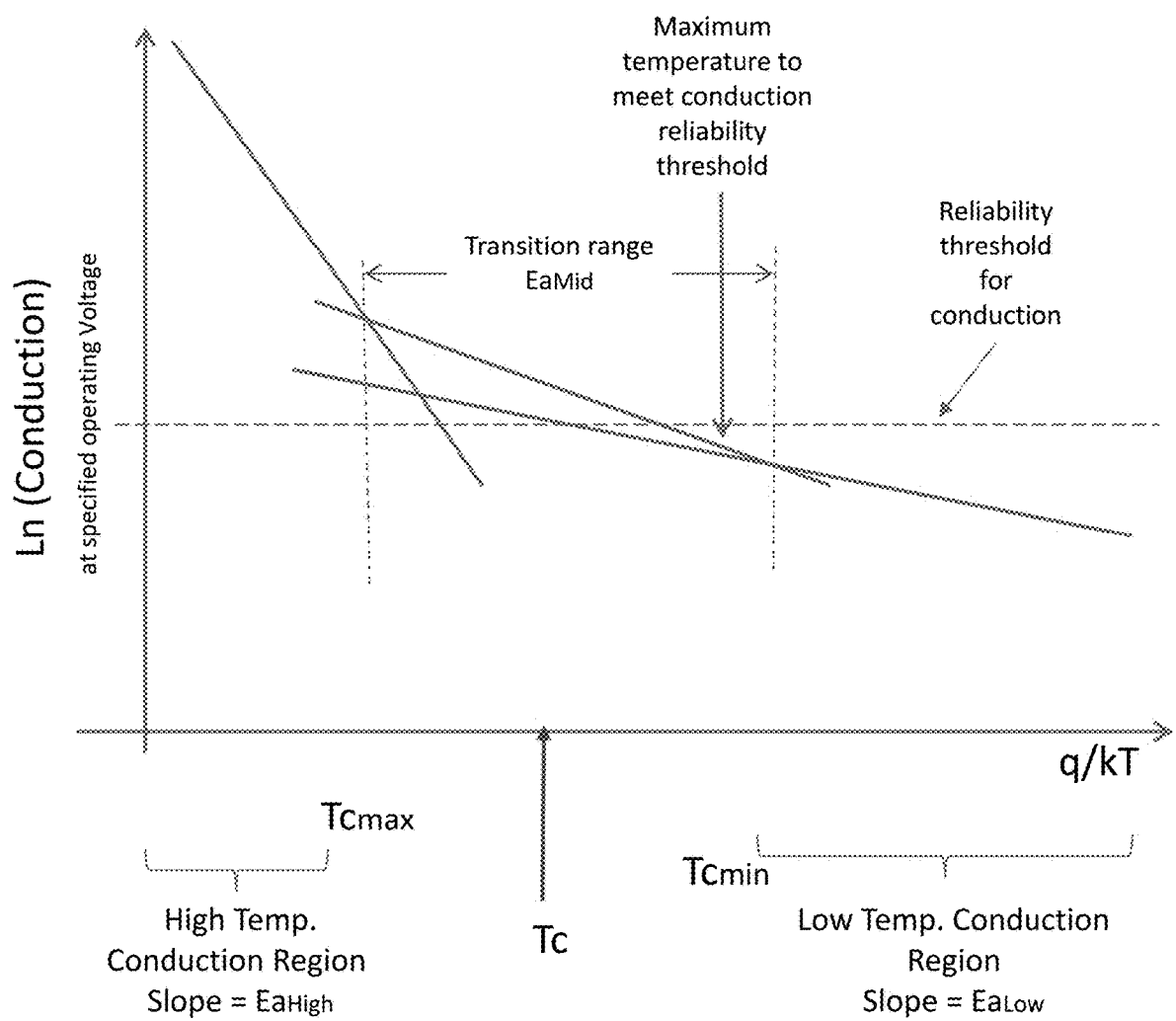
FIG. 15 shows a schematic plot of Ln (Conduction) vs. q/kT for a fifth example scenario.

FIG. 15 shows a plot of Ln(conduction) vs. q/kT for a fifth example of a material in which there is a transition from a low temperature conduction region characterized by a first activation energy $Ea_{Low}$, below transition temperature Tc, and a high temperature conduction region characterized by a second activation energy above Tc, in which the conductivity transition occurs over a larger conductivity transition range, between $Tc_{max}$ and $Tc_{min}$. For example, Tc is defined in the middle of this range, and is e.g. 100 C, similar to Example 4. However, in this example, $Ea_{Low}$ is larger, so that conduction increases more rapidly with temperature, exceeding the reliability threshold as the temperature enters the transition range. To maintain the conduction at a value below the required reliability threshold for conduction, e.g. $3 \times 10^{-13}$ S/cm, the maximum operating temperature Tmax is limited to just over $Tc_{min}$.

In principal, there may be many combinations of characteristics Tc, $Ea_{Low}$ and $Ea_{High}$ that can provide reliable high voltage, high temperature operation so long as the total conductance is maintained below a required threshold value, e.g. approximately $5 \times 10^{-13}$ S/cm at the required maximum operating voltage and temperature.

By way of example, the Table shown in FIG. 16 lists experimental data for ten samples, i.e. five dielectric epoxy laminate compositions, for each of two cures: a SLS (Soft Lamination Stage) cure in which the epoxy composition is partially cured, e.g. to hold together laminations, and a FL (Full Lamination) cure, in which the epoxy composition is fully cured, i.e. hard lamination. The temperature dependence of leakage current was determined for each of the samples by sweeping the voltage over a range of 0V to 650V, applied in the Z direction, for a set of temperatures over a temperature range of 0 C to 200 C, to obtain values for Tc (C), the first activation energy $Ea_{Low}$ (eV) and the second activation energy $Ea_{High}$ (eV) as described above. Also listed are the measured values of the conductivity (S/cm) at 150 C and leakage (A/cm$^2$) at 150 C.

Over the measured temperature range, the plots of ln (Conduction) vs. 1/kT for each of these samples showed a distinct (sharp) conduction transition temperature Tc, between a low temperature conduction region characterised by a first activation energy $Ea_{Low}$ and a high temperature conduction region characterized by a second activation energy $Ea_{High}$, where $Ea_{High}$ is greater than $Ea_{Low}$, i.e. similar to the form of plots illustrated schematically for the Examples shown in FIGS. 11 to 13. Thus, a distinct conduction transition temperature Tc was obtained for each sample. In the temperature range tested, none of the samples showed a broader conduction transition range as illustrated schematically for the Examples shown in FIGS. 14 and 15.

Figure 17:
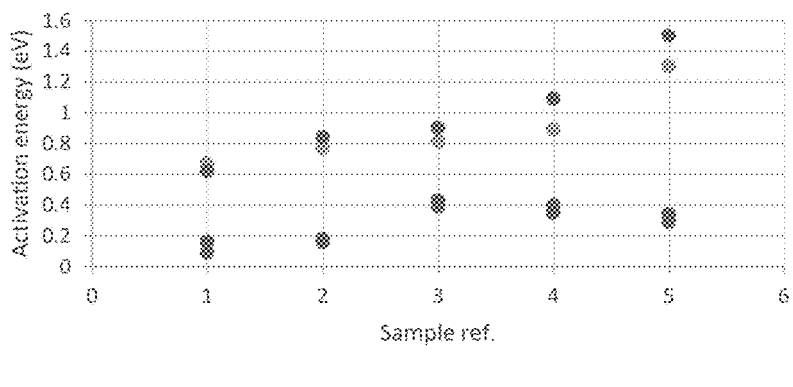
FIG. 17 shows a plot ranking the samples by activation energies $Ea_{Low}$ and $Ea_{High}$.
Figure 18:
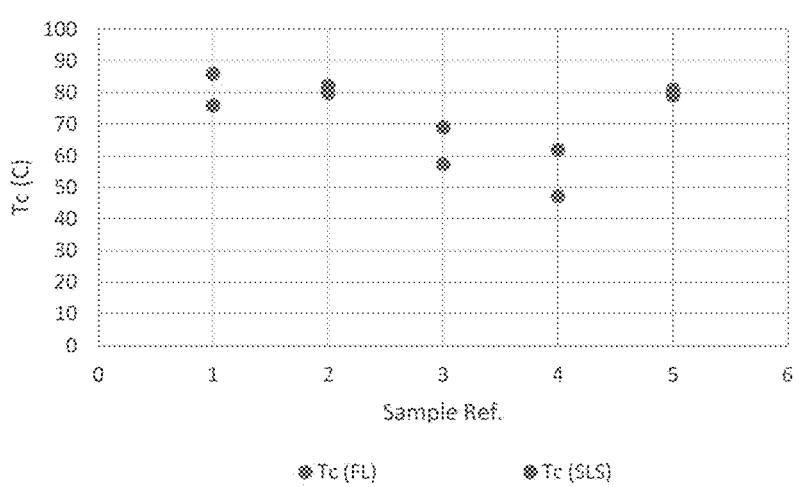
FIG. 18 shows a corresponding comparison of Tc for each sample.
Figure 19:
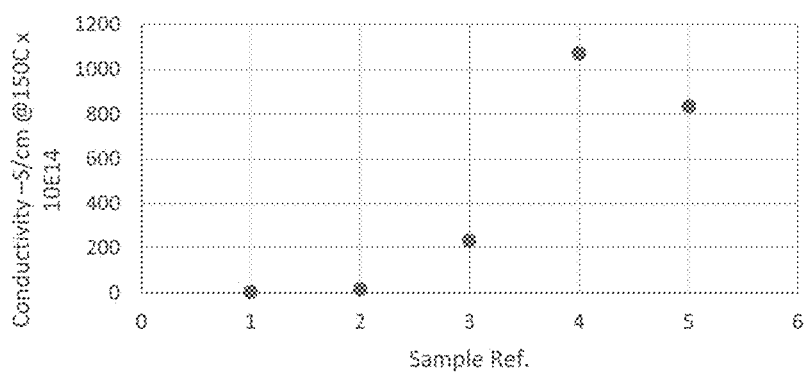
FIG. 19 shows a corresponding comparison of conductivity S/m@150×10E14 for each sample.
Figure 20:
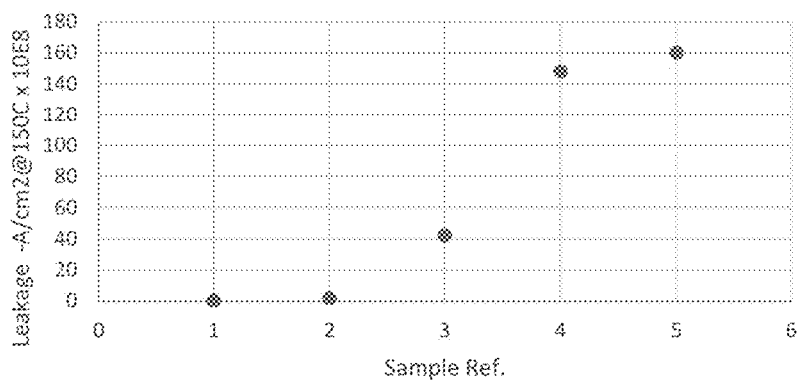
FIG. 20 shows a corresponding comparison of Leakage A/cm$^2$@150 C×10E8 for each sample.

The plots shown in FIGS. 17 to 20 compare parameters for each sample listed in the table of FIG. 16. FIG. 17 shows a plot of activation energies $Ea_{Low}$ and $Ea_{High}$ for the ten samples, ranked in order of increasing $Ea_{High}$. FIG. 18 shows a corresponding comparison of Tc for each sample; FIG. 19 shows a corresponding comparison of conductivity; and FIG. 20 shows a corresponding comparison of leakage.

Referring to FIG. 17, all samples have a low temperature activation energy $Ea_{Low}$ below 0.5 eV. The high temperature activation energy $Ea_{High}$ increases from sample Ref. 1 to Ref. 5.

Sample DOE7501 (Ref./Rank 1) which comprises a R1577 laminate core and E-770G epoxy prepreg, showed the lowest conductivity, i.e. $4.75 \times 10^{-14}$ S/cm for the SLS cure, and $2.27 \times 10^{-14}$ S/cm for the FL cure. Corresponding values of leakage for SLS cure and FL cure were $1.06 \times 10^{-8}$ A/cm$^2$ and $2.9 \times 10^{-9}$ A/cm$^2$. These samples also had the lowest values of $Ea_{Low}$ (0.16 eV and 0.09 eV) and $Ea_{High}$ (0.62 eV and 0.67 eV), and conductivity transition temperatures of 75.8 C and 85.6 C, respectively. Thus, this combination of characteristics demonstrated that the Hitachi R1577/E-770G material to be superior in terms of electrical conduction and other characteristics for use in high voltage, high temperature embedded packaging comprising an epoxy laminate composition.

Sample DOE7504 (Ref./Rank 2), comprising a R1577 laminate core and Hitachi E-679 epoxy prepreg ranks a close second and may prove useful in high voltage embedded packaging. This sample had a conductivity of $1.8 \times 10^{-13}$ S/cm for the SLS cure, and $1.4 \times 10^{-13}$ S/cm for the FL cure; the corresponding value of leakage for SLS cure was $2.5 \times 10^{-8}$ A/cm$^2$ and $1.8 \times 10^{-8}$ A/cm$^2$ for FL cure. The values of $Ea_{Low}$ (0.18 eV and 0.16 eV) are close to those of sample DOE7501, and $Ea_{High}$ (0.84 eV and 0.77 eV) are higher, and the conductivity transition temperatures of 82.0 C and 79.7 C are similar to values for DOE7501 (Ref./Rank 1).

In comparison to Sample DOE7501 (Ref./Rank 1) and Sample DOE7504 (Ref./Rank 2), the other epoxy compositions exhibit higher values of $Ea_{High}$, and significantly higher values of conductivity and leakage.

For sample ref./rank 4, $Ea_{Low}$ is below 0.5 eV and $Ea_{High}$ is around 1 eV; however, Tc is the lowest of this group of samples, around 50 C. Thus, for operation at 100 C to 150 C, well above Tc, the higher value of $Ea_{High}$ results in high conductivity and leakage. For example, for sample ref./rank 5, $Ea_{Low}$ is less than 0.4 eV, and Tc is high, but since $Ea_{High}$ is >1 eV, for operating temperatures over the Tc of 80 C, the high value of $Ea_{High}$ results rapidly increasing conductivity and leakage with temperature. Sample ref./rank 3 fall in between.

Based on these parameters, the performance of samples ref. 1 and 2 is superior for high temperature and high voltage operation, e.g. for high voltage/high temperature power semiconductor devices, such as GaN HEMTs operating at ≥100V and ≥100 C.

By comparison, samples ref. 3 to 5 are not suitable for this application. At 150 C, each of these epoxy compositions exhibits significantly higher conductivity, i.e. $>10^{-12}$ S/cm, and leakage, i.e. $>10^{-7}$ A/cm$^2$ at 150 C, higher $Ea_{Low}$ values in a range from 0.29 eV to 0.4 eV and $Ea_{High}$ values in a range from 0.81 eV to 1.5 eV. The conductivity transition temperatures Tc of samples DOE7502 and DOE7503 are low, in the range 47.1 C to 69 C. Although sample DOE7500 has a high conductivity transition temperature, 79.0 C for SLS cure and 80.8 C for FL cure, the higher values of $Ea_{Low}$ and particularly the higher values of $Ea_{High}$ lead to higher values of conductivity and leakage at 150 C.

In principal, to select an appropriate epoxy composition, there can be many combinations of Tc, $Ea_{Low}$ and $Ea_{High}$ characteristics that can work, so long as the total conductance is less than a required threshold value, e.g. $<5 \times 10-13$ S/cm, or preferably $<5 \times 10^{-14}$ S/cm, at the maximum operating voltage and temperature.

Based on these experimental results, it is possible to provide guidelines for selecting an epoxy with a combination of values of parameters comprising conductivity, leakage, first and second activation energies, that can provide a reliable material for an embedded package for high voltage operation at ≥150 C of power semiconductor devices.

Firstly, the low temperature conduction characteristics should exhibit an activation energy $Ea_{Low}$ that is low, e.g. ≤0.2 eV and preferably closer to zero. A low activation energy for the low temperature conduction range implies a well cured epoxy composition with dense cross-linking, which is suitable for embedded packaging applications. If Tc is high, and the operating temperature is below Tc, a high Tc in combination with a first activation energy $Ea_{Low}$ which is close to zero, e.g. ≤0.2 eV, is expected to provide a conductivity below a required threshold value, e.g. of $5 \times 10^{-13}$ S/cm.

If Tc is below the maximum operating temperature, the high temperature conduction characteristics are more important, because conduction increases more rapidly with temperatures over Tc. To maintain the conductivity below the reliability threshold, the second activation energy $Ea_{High}$ for temperatures above Tc, should be ≤1.0 eV, and preferably below 0.75 eV. For example, for Tc ≥70 C, or Tc ≥80 C, or Tc ≥100 C, for an operating temperature above Tc, it is important that $Ea_{High}$ is small enough to maintain conduction below the reliability threshold of conduction in the operating temperature range above Tc.

The data shown in the Table in FIG. 16 provide examples to assist in quantifying values of Tc, $Ea_{Low}$ and $Ea_{High}$, conduction and leakage for some samples of commercially available epoxy laminate compositions to assess suitability for high voltage and high temperature operation. These data are provided by way of example only for these materials systems. For other dielectric polymer compositions and other applications, the minimum achievable leakage current and conduction values may fall within other ranges. However, this test methodology allows for comparison of different materials, e.g. by comparison and ranking of Tc, $Ea_{Low}$ and $Ea_{High}$, conduction and leakage, to assist in selecting an appropriate material system for improved reliability, e.g. for at least one of high temperature operation and high voltage operation, particular when small die size and compact packaging results in operation under high electric fields and temperatures ≥100 C.

This test methodology also provides for testing of the homogeneity of the dielectric composition and effectiveness of curing of dielectric composite materials for embedded packaging. For example, for an ECP processing, batch processing provides for embedding of an array of many die in large sheets of dielectric laminate and prepreg layers. These large sheets are then drilled to form micro-vias and through substrate vias, which are filled with plated copper to form electrical interconnects and thermal interconnects. For example, it is well known that, for uniformity of laminate sheets and prepreg layers, there is a need for a correct stoichiometric mix of resin to hardener. Since epoxy composite dielectrics also contain dielectric fillers and other additives, any incomplete mixing may result in inconsistent material properties across a batch of embedded die packages.

A non-uniform mix may result in inhomogeneities across the sheets of laminate and prepreg, leading to inconsistencies in curing, with different degrees of cross-linking. For operation under high temperature and high voltage, inconsistencies in composition and curing may adversely affect conduction and leakage. For embedded die packing of high current, high voltage power semiconductor devices, a proposed approach is to provide test structures distributed across in each sheet, so that in each batch, several test structures can be tested for Tc, $Ea_{Low}$, $Ea_{High}$, conduction and leakage to verify the dielectric meets specifications for the rated operating voltage and temperature of the embedded die. This test methodology may also be useful in providing additional electrical parameters for evaluating the effectiveness of cure processes, e.g. single stage or multistage cure processes for embedded packaging. For example, some processes for curing epoxy laminate materials use with a multi-stage cure, e.g. an initial partial cure or soft lamination to bond layers, which results in partial cross-linking, partially locking in the structure, followed by full cure to increase cross-linking and fully harden the dielectric layers. Measurements of Tc, $Ea_{Low}$, $Ea_{High}$, conduction and leakage for samples of dielectric polymer compositions processed with different mixing and preparation steps, and different cure processes may assist with formulation of dielectric polymer compositions and curing processes to optimize electrical properties of dielectric materials for embedded packaging of power semiconductor devices for operation at high temperature and high voltage, particularly for chip-scale packaging, where the small dimensions of the package result in high electric fields.

For the materials tested, the measured conductivity transition temperatures Tc occur below the glass transition temperature for these materials. At this time, further work is required to determine if there is a correlation between the conductivity transition temperature Tc and the glass transition temperature Tg and other mechanical properties such as CTE, elastic modulus, et al. of the dielectric materials which were tested.

The device structures and test methodology disclosed herein are applicable to providing improved reliability for embedded packaging and laminated packaging of lateral GaN power switches such as GaN HEMTs and other nitride semiconductor devices, such as power switching devices and systems comprising nitride power transistors which more generally comprise III-Nitride semiconductors of other compositions, and also for power switching devices comprising Si and SiC switching devices, e.g. high voltage Si IGBTs and SiC power transistors for operation at voltages in the range from 100V to 1700V. For example, for various applications, switching systems may be provided for one of ≥100V operation; 300V to 400V operation; ≥600V operation; and ≥1200V operation.

Selection of appropriate dielectric epoxy compositions for laminated packages, to meet a reliability threshold for leakage and conduction, enables more reliable high voltage operation (>100V) at high temperature (>100 C), to assist in achieving a long lifetime without performance degradation, even with small geometry layouts and small package sizes. While experimental results are disclosed for some exemplary dielectric epoxy compositions, it is expected that the test methodology may be extended to evaluating other dielectric polymer compositions for use in semiconductor packaging for high voltage and high temperature power semiconductor switching devices, such as GaN e-HEMTs.

The test methodology disclosed herein provides an improved understanding of the effects of temperature and electric field on electrical conduction characteristics of the dielectric epoxy compositions forming the dielectric body of a semiconductor package, and how the dielectric material interacts with the bias on a semiconductor die embedded into the dielectric body of the package. It is demonstrated that dielectric epoxy compositions can be characterized by a conductivity transition temperature Tc, a first activation energy for conduction at temperatures below Tc, and a second activation energy for conduction at temperatures above Tc. Characterization of existing epoxy compositions to identify materials having a high conductivity transition temperature, preferably above the rated operating temperature, and low first activation energy for conduction below Tc, enables selection of dielectric epoxy composition which provide improved reliability for high temperature and high voltage operation. Improved understanding of the effects of temperature and electric field on epoxy compositions may also assist in formulation of materials having a higher conductivity transition temperature Tc, e.g. >100 C or >150 C, and low conductivity over the required operating temperature range, while still achieving the other materials characteristics needed for volume manufacture for semiconductor packaging. Where Tc is below the operating temperature, selection of materials having a smaller activation energy for conduction above Tc, allows for conductivity in the operating range above Tc to be maintained below a reliability threshold. For example, for the sample data shown in FIG. 16, samples DOE7501 and DOE7504, having a Tc in a range of 70 C to 90 C, e.g. >75 C, combined with a high temperature activation energy Eahigh below 1.0 eV, and preferably below 0.75 eV, showed significantly lower conductivity and leakage than the other samples. These data also assist in designing packaging for high voltage/high current power switching devices, e.g. for optimizing conductivity and operating field strength, which based on voltage and geometry of the package, to minimize degradation over the product lifetime, and to further optimize device performance.

While device structures and methods of embodiments have been described in detail, with examples of values of Tc, EaLow, EaHigh, conduction and leakage, these are provided by way of example only.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A power semiconductor device comprising:
a package comprising a dielectric body;
a power semiconductor die embedded in the dielectric body of the package;
the power semiconductor die being rated for operation with at least one of a rated operating voltage ≥100V and a rated operating temperature ≥100 C,
wherein, the dielectric body comprises a dielectric polymer composition that provides a conductivity less than a reliability threshold value of conduction for the rated operating voltage and temperature.

2. The power semiconductor device of claim 1, wherein the reliability threshold value of conduction is ≤2×10$^{-13}$ S/cm.

3. The power semiconductor device of claim 1, wherein the reliability threshold value of conduction is ≤5×10$^{-14}$ S/cm.

4. The power semiconductor device of claim 1, wherein the reliability threshold of conduction comprises a current leakage ≤3×10$^{-8}$ A/cm$^2$.

5. The power semiconductor device of claim 1, wherein the reliability threshold of conduction comprises a current leakage ≤3×10$^{-9}$ A/cm$^2$.

6. The power semiconductor device of claim 1, wherein the dielectric polymer composition is characterized by:
a conduction transition temperature Tc,
a first activation energy $Ea_{Low}$ for conduction in a first range of temperatures below Tc,
a second activation energy $Ea_{High}$ for conduction in a second range of temperatures above Tc, and
the dielectric polymer composition having values of Tc, $Ea_{Low}$, and $Ea_{High}$ that provide said conductivity less than a reliability threshold value of conduction for the rated operating voltage and temperature.

7. The power semiconductor device of claim 6, wherein the first activation energy $Ea_{Low}$ is a specified first threshold activation energy of ≤0.2 eV.

8. The semiconductor device of claim 6, wherein the second activation energy $Ea_{High}$ is a specified second threshold activation energy of ≤1 eV.

9. The power semiconductor device of claim 6, wherein Tc is greater than the rated operating temperature and $Ea_{Low}$ has a value ≤0.2 eV that maintain the conduction below a reliability threshold of ≤2×10$^{-13}$ S/cm.

10. The power semiconductor device of claim 6, wherein Tc is less than the rated operating temperature, $Ea_{Low}$ has a value ≤0.2 eV, and $Ea_{High}$ has a value ≤1 eV that maintains the conduction below a reliability threshold of ≤5×10$^{-14}$ S/cm.

11. The power semiconductor device of claim 6, wherein Tc is less than the rated operating temperature, $Ea_{Low}$ has a value ≤0.2 eV, and $Ea_{High}$ has a value ≤1 eV that maintains the conduction below a reliability threshold of ≤2×10$^{-13}$ S/cm.

12. The power semiconductor device of claim 6, wherein Tc is greater than the rated operating temperature and $Ea_{Low}$ has a value ≤0.2 eV that maintain the conduction below a reliability threshold of ≤5×10$^{-14}$ S/cm.

13. The power semiconductor device of claim 1, wherein the dielectric polymer composition is a dielectric epoxy composition.

14. The power semiconductor device of claim 1, wherein the dielectric polymer composition is a laminated epoxy composition.

15. The power semiconductor device of claim 6, wherein Tc is ≥100 C.

16. The power semiconductor device of claim 6, wherein Tc is ≥75 C.

17. The power semiconductor device of claim 1, wherein the power semiconductor die comprises at least one of a power transistor and a power diode.

18. The power semiconductor device of claim 17, wherein the power transistor comprises a lateral GaN power transistor.

19. The power semiconductor device of claim 17, wherein the power switching transistor comprises a lateral GaN e-HEMT which is rated for ≥100V operation.

20. The power semiconductor device of claim 17, wherein the power switching transistor comprises a lateral GaN e-HEMT which is rated for ≥600V operation.

21. The power semiconductor device of claim 17, wherein the power switching transistor comprises a SiC MOSFET or a Si IGBT.

* * * * *